United States Patent [19]

Rayne et al.

[11] Patent Number: 5,215,961

[45] Date of Patent: Jun. 1, 1993

[54] MACHINABLE OXIDE CERAMIC

[75] Inventors: Roy J. Rayne, New Carrollton, Md.; Louis E. Toth, Washington, D.C.; L. David Jones, Woodbridge, Va.; Robert J. Soulen, Jr., Rockville, Md.; Barry A. Bender, Alexandria, Va.

[73] Assignee: The United States of America as represented by the Secretary of the Navy, Washington, D.C.

[21] Appl. No.: 543,132

[22] Filed: Jun. 25, 1990

[51] Int. Cl.$^5$ .............. C01G 29/00; C04B 35/60
[52] U.S. Cl. .......................... 505/1; 505/782; 505/739; 501/123; 501/126; 264/66; 264/67; 264/235
[58] Field of Search ............ 505/1, 782, 739; 501/123, 126; 264/66, 67, 235

[56] References Cited

U.S. PATENT DOCUMENTS 5,047,391 9/1991 Bock et al. .................. 505/739

OTHER PUBLICATIONS

Das et al, "Casting High-$T_c$ Superconducting BiSCCO", *Journal of Superconductivity* vol. 2, #2, Jun. 1989, pp. 253-263.
Oota et al, Superconductivity at 100K in Bi-Pb-Sr-Ca-Cu-O, Jap. Jour. Appl. Phys., vol. 27, No. 8, Aug. 1988, pp. L1445-L1447.
Bock et al, "Preparation of Single Phase 2212 Bismuth Strontium Calcium Coprate by Melt Processing", *Solid State Communications*, vol. 72, #5, pp. 453-458, 1989.
*Handbook of Glass Manufacture*, p. 345, 1958.
Garzon et al, "Amorphous-Crystalline Transformation in Bismuth-Oxide-Based High Superconductors", *Appl. Phys. Lett.* 53(9) 29 Aug. 1988, pp. 805-807.
Hicks et al, "Preparation of Bi-Sr-Ca-Cu-O Superconductors from Oxide-Glass Precursors", *Appl. Phys. Lett.* 53(5) 1 Aug. 1988, 423-25.
Rayne et al., "Machining Superconducting BSSCO Devices", Physica C 162-164, 1989, pp. 879-880.
Shelton, et al., "Machining Superconducting BISCCO Devices", Physica C, 162-164 (1989) 879-880.

*Primary Examiner*—Karl Group
*Assistant Examiner*—C. M. Bonner
*Attorney, Agent, or Firm*—Thomas E. McDonnell; Thomas V. Flannagan; Barry A. Edelberg

[57] ABSTRACT

A machinable high Tc ceramic superconductor is formed by weighing and mixing appropriate stoichiometric amounts of $Bi_2O_3$, $SrCO_3$, $CaCO_3$, and CuO (BSCCO), removing carbonates from the mixture, melting the mixture, casting the melted mixture into a mold, and inducing superconductivity and growth of randomly oriented platelets in the cast.

15 Claims, No Drawings

MACHINABLE OXIDE CERAMIC

BACKGROUND OF THE INVENTION

1. Field of the Invention

The invention relates to a new machinable superconducting ceramic and a method of making such a ceramic.

2. Description of the Background Art

Bulk, high Tc ceramic superconductors are believed to possess properties similar to other ceramics, i.e. they are hard and brittle and not suited for standard machining operations. There have been attempts to improve the machinability of bulk, high Tc ceramic superconductors by processing from the melt, as in casting, with the $REBa_2Cu_3O_7$ superconductors, but these have not been successful. They are subject to incongruent melting which destroys the superconducting phase. Furthermore, the melts are very reactive with nearly all crucibles. What is needed is a high Tc superconductor that is machinable with conventional metal working machines and steel tools, so that the superconducting ceramic can be easily shaped into various devices.

SUMMARY OF THE INVENTION

Accordingly, it is an object of this invention to form a machinable high Tc ceramic superconductor.

It is also an object of this invention to provide a method of forming a high Tc ceramic superconductor.

It is also an object of this invention form a high Tc ceramic superconductor with randomly oriented platelet microstructure.

These and other objects of the invention are accomplished by weighing and mixing appropriate stoichiometric amounts of $Bi_2O_3$, $SrCO_3$, $CaCO_3$, and CuO (BSCCO), removing carbonates from the mixture, melting the mixture, casting the melted mixture into a mold, and inducing superconductivity and growth of randomly oriented platelets in the cast.

DETAILED DESCRIPTION OF THE INVENTION

The starting materials of the invention are the powders of $Bi_2O_3$, $SrCO_3$, CuO, and $CaCO_3$. These powders are finely ground to increase surface area for reacting and measured out to give the desired stoichiometric proportions. Preferably, the powders are measured in stoichiometric proportions to give a nominal composition of $Bi_2Sr_2Ca_1Cu_2O_x$(2212), 2223, 4336, 4334, 1112, 2245, or 2234. It is important to note that lead may also be used to substitute partially for the bismuth. For instance, where the stoichiometry would require $Bi_2$, one could have y amount of Pb and 2-y amount of Bi. In this case, an oxide of lead would be an additional starting material. Generally, the powders are considered finely ground if the particle size is between about 2 and 10 microns in diameter. The powders are mixed until the powder is a uniform color. Any means of mixing may be used, however, a mortar and pestle is preferred.

The mixed powder is then calcined to remove $CO_2$ from the mixture. $CO_2$ is removed in order to reduce frothing of the mixture from the decomposition of carbonate in a subsequent melting step. The mixture can be placed in any suitable container for the calcination, as long as the container can withstand the heat and will not react with the mixture. Preferably, a platinum crucible is used. Although the mixture is calcined until the $CO_2$ has been removed, it is preferable to use a combination of calcining and grinding until the mixture is fully calcined. Preferably, the mixture is heated to between about 700° C. and 800° C. and kept at that temperature for between about 25 to 35 minutes. The mixture is then ground and then recalcined at temperature about 25° higher for the same amount of time. This cycle is repeated until a temperature of between about 820° and 830° C. is reached. Then, the mixture is kept at between about 830° and 840° C. for between about 11 to 13 hours, or until the mixture is fully calcined. Most preferably, the mixture is initially calcined at about 775° C. for about 30 minutes and then ground. This cycle is repeated with an increase of about 25° until about 825° C. is reached. Then the mixture is heated at about 835° C. for about 12 hours.

Once the mixture has been calcined, it is heated in order to melt the mixture. This step not only melts the mixture, it also ensure that any residual $CO_2$ is removed. Although the mixture should be heated until the mixture melts, the time and temperature required will, of course, vary depending on the nominal composition and the calcining process. For example, powder rich in Bi will melt at a lower temperature than a powder rich in Ca and Cu. Similarly, powder that reacts somewhat during calcining to form predominantly the 2212 phase will melt more congruently and at a lower temperature than does unreacted powder. Preferably, though, heating the powder to between about 1000° C. and 1200° C. and then rapidly increasing the temperature to between about and about 1400° C. and holding it there for between about 15 to about 20 minutes will ensure complete melting. Most preferably, the mixture is heated to about 1100° C. then rapidly increased to 1200° C. and held for about 15 minutes.

The melted mixture is then "melt-cast" into a mold. Any mold that will not react with the melted mixture may be used, but preferably the mold is made out of stainless steel, $Al_2O_3$, $ZrO_2$, glassy carbon, or copper. Most preferably, copper is used. The mold should be preheated. If the mold is at too low of a temperature, cracking will occur. Similarly, too high of a temperature will cause the mold to react with the melt. Therefore, pre-heating the mold to between about 300° and 500° C. is preferred. Most preferably, the mold is preheated to about 300° C. The melt is then poured into the pre-heated mold and the resulting melt/mold placed in an air furnace at the pre-heat temperature. Once the temperature of the melt comes down to the temperature of the furnace, the melt/mold (now a cast/mold) is allowed to air cool to room temperature.

The next step is crucial to the method of the invention. When the BSCCO is melted, it loses one oxygen atom per unit cell and its superconductivity. Therefore, the casting must be treated in order to restore the superconducting phase and induce the growth of randomly oriented platelets, since it is these randomly oriented platelets that account for the machinability of the superconducting ceramic. Preferably, this is accomplished by a subsequent heat treatment of the casting. This heat treatment reincorporates the oxygen, which in turn, induces the necessary phase and structural transformations of the material, resulting in a machinable ceramic.

Preferably, the casting is heated from room temperature to between about 700° C. and about 800° C. at a rate of between about 4° to about 6° per minute and held at that temperature for between about 12 to about 14 hours. Most preferably, the casting is heated to about 750° C. and held there for about 13 hours. The casting is then heated further to between about 820° to about 860° C. at a rate of between about 1° to about 2° per minute and held there for between about 50 to about 70 hours. Most preferably, the casting is further heated to about 840° C. and held there for about 60 hours. The casting is then cooled to room temperature at a rate of between about 10° to about 20° per minute. Most preferably, the casting is cooled at a rate of about 10° per minute.

The resulting ceramic is machinable and may be machined into various devices by conventional metal cutting techniques.

Having described the invention, the following examples are given to illustrate specific applications of the invention. These specific examples are not intended to limit the scope of the invention described in this application.

EXAMPLE I

Stoichiometric amounts of reagent grade $SrCO_3$, CuO, $CaCO_3$, and $Bi_2O_3$ were weighed out in proportions to form an approximate stoichiometry of $Bi_2Sr_2Ca_3Cu_4O_x$, where x would be the amount of oxygen taken up by the sample during the processing. The sample was mixed using a mortar and pestle until the resultant powder was uniform in color. The mixed powder was calcined in a platinum crucible in air at 775° C. for 30 minutes then ground using a mortar and pestle. This was repeated, increasing the calcining temperature 25° C. until 825° C. was reached. The powder was then calcined at 835° C. for 12 hours.

The powder was then placed in a Pt crucible in a furnace at 1100° C., then heated rapidly to 1200° C. and held at that temperature for 15 minutes to ensure complete melting. The melt was poured into a copper mold, pre-heated to 300° C. then placed in a furnace at 300° C. and allowed to furnace cool. An analysis of the casting was performed using SEM, EDS, XRD, and DTA techniques. The analysis revealed that the as-cast sample consisted of two distinct regions —an amorphous or glassy region adjacent to the mold and an interior region with ill-defined microstructure. There was no evidence of any BSCCO phases having formed.

The casting was removed from the mold and heat treated in air using the following schedule: the sample was heated from room temperature to 750° C. at 5° C. per minute and held at that temperature for 13 hours, then heated to 840° C. at 1° C. per minute and held at that temperature for 60 hours, then cooled to room temperature at 10° C. per minute.

Analysis of the heat treated sample showed a transformation of the two distinct regions of the as-cast sample into one homogeneous region. SEM analysis showed 2212 to be the predominant phase, with secondary phases $Ca_2CuO_3$, CuO and a very small amount of SrO and Bi-Sr-Ca-O. TEM analysis indicated that most of the 2212 grain boundaries were clean, that is, free of the amorphous phase.

A superconducting magnetic shield was successfully fabricated from the heat treated ceramic in a lathe using conventional metal working techniques. The casting was machined to close tolerances without taking any special precautions. The machined surface was very smooth except where there was local platelet orientation and the cutting tool appeared to have pulled out bits of material of approximately 0.25 mm diameter. In regions where the surface was very smooth, the microstructure of platelets was random, three dimensional and resembled a "House of Cards."

The shield had excellent magnetic properties, 145 Gauss at 4.2 K.

EXAMPLE II

A BSCCO casting that had been cooled from the melt as in Example I (but not heat-treated) was heated in a thermogravimetric analyzer at 5° C./min. in air to 1000° C., then the furnace turned off. As the sample was heated from 550° C. to 850° C., it gained 1.7% mass, then lost 1.2% mass from 900° C. to 1000° C. The results indicate that when BSCCO melts at around 950° C. oxygen is lost but during casting the sample cools faster than it can oxygenate and therefore it gains oxygen during the heat treatment.

Obviously, many modifications and variations of the present invention are possible in light of the above teachings. It is therefore to be understood that within the scope of the appended claims, the invention may be practiced otherwise than as specifically described.

We claim:

1. A method of forming a machinable bulk superconductor by melt-casting comprising the steps of:
    weighing out amounts of powdered $SrCO_3$, CuO, $CaCO_3$, and $Bi_2O_3$ for the desired stoichiometry of the superconductor;
    combining the amounts of $Bi_2O_3$, $SrCO_3$, CuO and $CaCO_3$ to form a mixture of uniform color;
    removing the carbonates in the mixture;
    heating the mixture until the mixture melts completely, to form a melt;
    pouring the melt into a pre-heated, non-reactive mold;
    cooling the melted mixture in the mold to room temperature, to form a casting;
    inducing a superconducting phase having randomly oriented platelets within the casting; and
    machining, by a metal cutting technique, said casting having said induced superconducting phase;
    wherein said machining step is performed with a steel tool.

2. A method as described in claim 1 wherein the step of inducing a superconducting phase having randomly oriented platelets within the casting comprises:
    heating the casting from room temperature to between about 700° C. and about 800° C. at a rate of between about 4° to about 6° per minute;
    holding the casting at that temperature for between about 12 to about 14 hours;
    heating the casting to between about 820° to about 860° C. at a rate of between about 1° to about 2° per minute;
    holding the casting at that temperature for between about 50 to about 70 hours;
    cooling the casting to room temperature at a rate of between about 10° to about 20° per minute.

3. A method as described in claim 2 wherein the step of removing the carbonates in the mixture comprises calcining the mixture.

4. A method as described in claim 3 wherein the desired stoichiometry is selected form the group consisting of $Bi_2Sr_2Ca_1Cu_2O_x$(2212), 2223, 4336, 4334, 1112, 2245, and 2234.

5. A method as described in claim 3 wherein the desired stoichiometry is 2234.

6. A method as described in claim 5 wherein calcining the mixture comprises the steps of:

heating the mixture to between about 700° C. and 800° C.;

keeping the mixture at that temperature for between about 25 to 35 minutes;

grinding the mixture;

increasing the temperature about 25° higher and keeping the mixture at that temperature for the same amount of time;

repeating the heating and grinding steps until a temperature of between about 820° and 830° C. is achieved;

heating the mixture at between about 830° and 840° C. for between about 11 to 13 hours.

7. A method as described in claim 2 wherein the mixture is heated to a first temperature between about 1000° C. and 1200° C. and then rapidly increased to a second temperature between about 1100° C. and about 1400° C., and higher than said first temperature, and held for between about 15 to about 20 minutes.

8. A method as described in claim 2 wherein the pre-heated, nonreactive mold is made of a material selected from the group comprising stainless steel, $Al_2O_3$, $ZrO_2$, glassy carbon, and copper.

9. A method as described in claim 2 wherein the pre-heated, nonreactive mold is at a temperature of between about 300° C. and about 500° C.

10. A method as described in claim 5 wherein the calcination comprises:

heating the mixture to about 775° C.;

keeping the mixture at that temperature for about 30 minutes;

grinding the mixture;

increasing the temperature about 25° higher and keeping the mixture at that temperature for the same amount of time;

repeating the heating and grinding steps until a temperature of about 825° C. is achieved;

heating the mixture at about 835° C. for about 12 hours.

11. A method as describe din claim 5 wherein the mixture is heated to about 1100° C. then heated rapidly to 1200° C. and held at that temperature for about 15 minutes.

12. A method as described in claim 5 wherein the mold is made of copper.

13. A method as described in claim 5 wherein the step of inducing a superconducting phase having randomly oriented platelets within the casting comprises:

heating the casting from room temperature to about 750° C. at a rate of about 5° C. per minute;

holding the casting at that temperature for about 13 hours;

heating the casting to about 840° C. at a rate of about 1° per minute;

holding the casting at that temperature for about 60 hours;

cooling the casting to room temperature at a rate of about 10° per minute.

14. The process of claim 1, wherein said melted mixture is cooled to room temperature by air cooling.

15. The method of claim 1, wherein said step of weighing out includes weighing out an amount of a source of lead for said desired stoichiometry of said superconductor and wherein said combining step includes combining said amount of said source of lead with said amounts of $SrCO_3$, $CuO$, $CaCO_3$, and $Bi_2O_3$ to form said mixture of uniform color.

* * * * *